(12) United States Patent
Taniguchi et al.

(10) Patent No.: US 12,232,268 B2
(45) Date of Patent: Feb. 18, 2025

(54) WIRING SUBSTRATE AND METHOD FOR MANUFACTURING WIRING SUBSTRATE

(71) Applicant: IBIDEN CO., LTD., Gifu (JP)

(72) Inventors: Hirotaka Taniguchi, Ogaki (JP); Akihide Ishihara, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 224 days.

(21) Appl. No.: 17/680,369

(22) Filed: Feb. 25, 2022

(65) Prior Publication Data

US 2022/0330432 A1 Oct. 13, 2022

(30) Foreign Application Priority Data

Apr. 12, 2021 (JP) .................. 2021-067403

(51) Int. Cl.
*H05K 1/18* (2006.01)
*H05K 1/11* (2006.01)
*H05K 3/00* (2006.01)
*H05K 3/46* (2006.01)

(52) U.S. Cl.
CPC ............ *H05K 1/183* (2013.01); *H05K 1/113* (2013.01); *H05K 3/0044* (2013.01); *H05K 3/4697* (2013.01); *H05K 3/4661* (2013.01); *H05K 2201/09072* (2013.01); *H05K 2201/09472* (2013.01); *H05K 2203/072* (2013.01); *H05K 2203/0723* (2013.01); *H05K 2203/308* (2013.01)

(58) Field of Classification Search
CPC ...... H05K 1/183; H05K 1/113; H05K 3/0044; H05K 3/4697; H05K 3/4661; H05K 2201/09072; H05K 2201/09472
USPC .......................................................... 174/261
See application file for complete search history.

(56) References Cited

U.S. PATENT DOCUMENTS

| | | | | |
|---|---|---|---|---|
| 2010/0252303 | A1* | 10/2010 | Chang ................. | H05K 3/4697 174/251 |
| 2011/0156228 | A1* | 6/2011 | Kobayashi .......... | H01L 23/3677 257/676 |
| 2012/0181074 | A1* | 7/2012 | Ishihara ................. | H05K 3/46 29/846 |
| 2015/0156880 | A1* | 6/2015 | Daizo ................. | B23K 26/364 174/251 |
| 2020/0323077 | A1* | 10/2020 | Han ..................... | H05K 3/0011 |

FOREIGN PATENT DOCUMENTS

JP 2010-245530 A 10/2010

* cited by examiner

*Primary Examiner* — Andargie M Aychillhum
(74) *Attorney, Agent, or Firm* — Oblon, McClelland, Maier & Neustadt, L.L.P.

(57) ABSTRACT

A wiring substrate includes an insulating layer, and a build-up part formed on the insulating layer and including an interlayer insulating layer and a conductor layer. The build-up part has a cavity penetrating through the build-up part such that the cavity is formed to accommodate an electronic component and has an inner wall and a bottom surface having a groove and that the groove is extending entirely in an outer edge part of the bottom surface and formed continuously from the inner wall surface of the cavity.

10 Claims, 14 Drawing Sheets

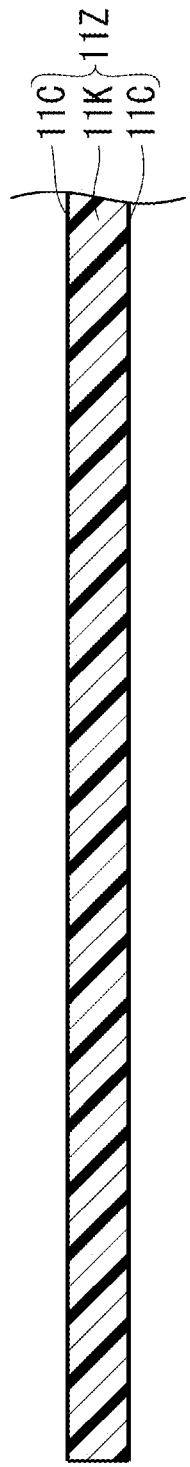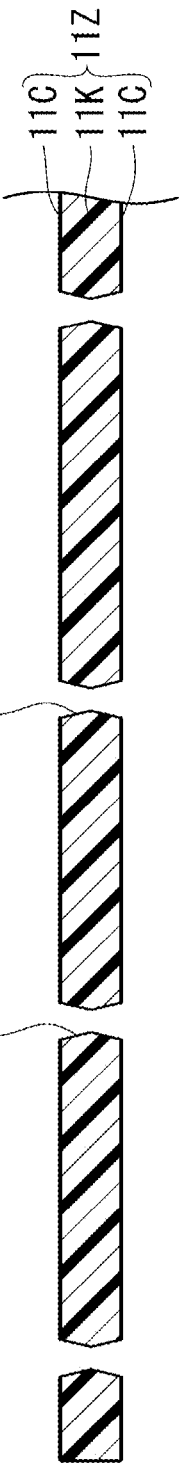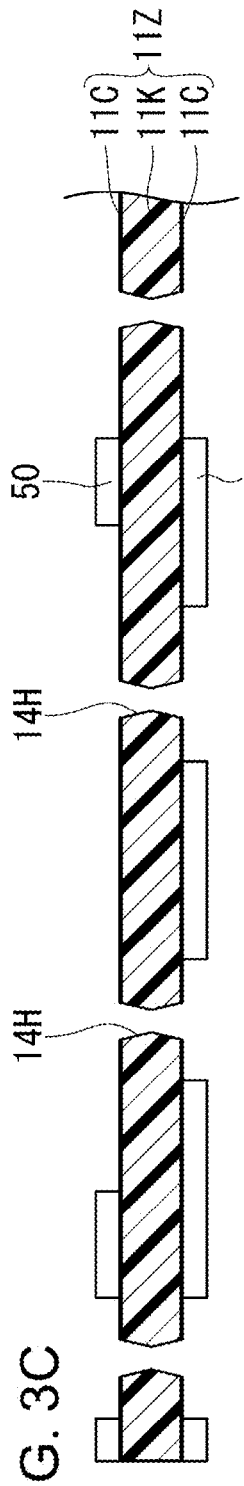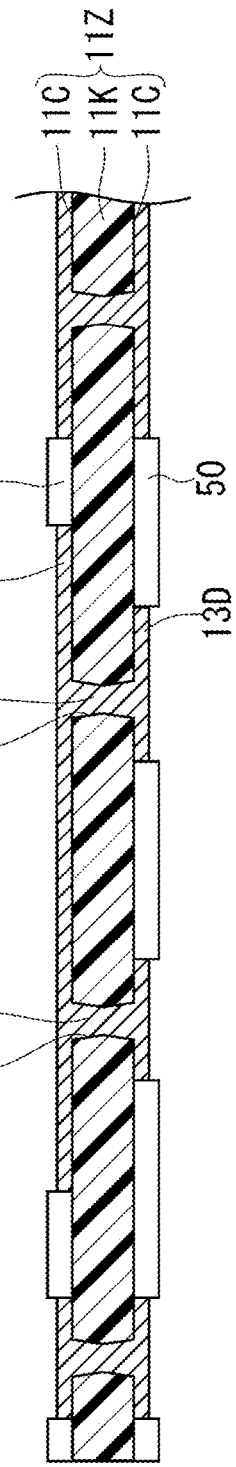

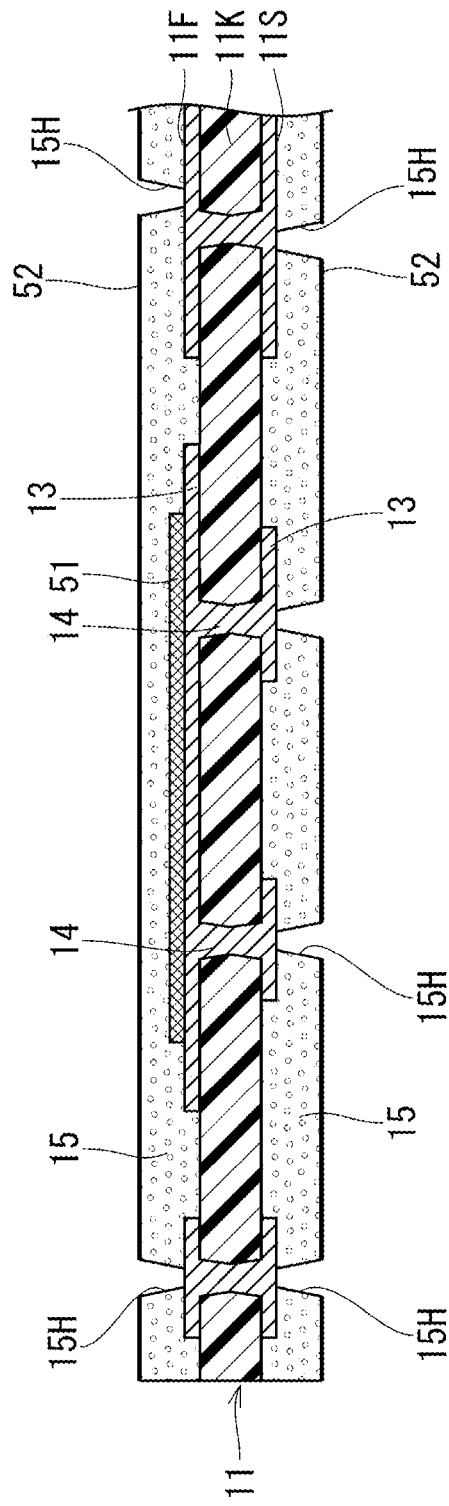
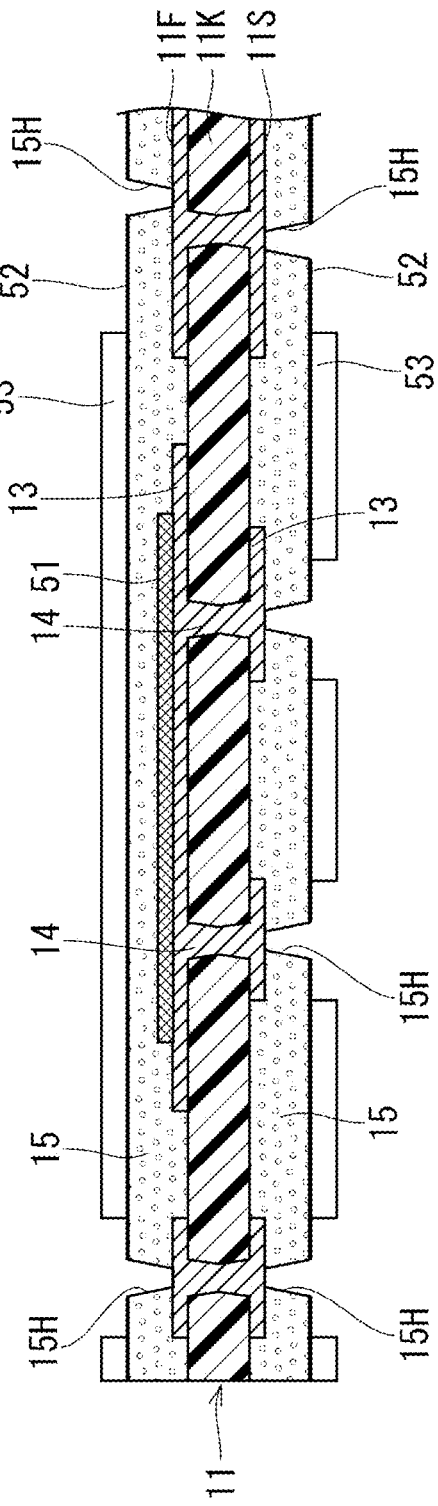

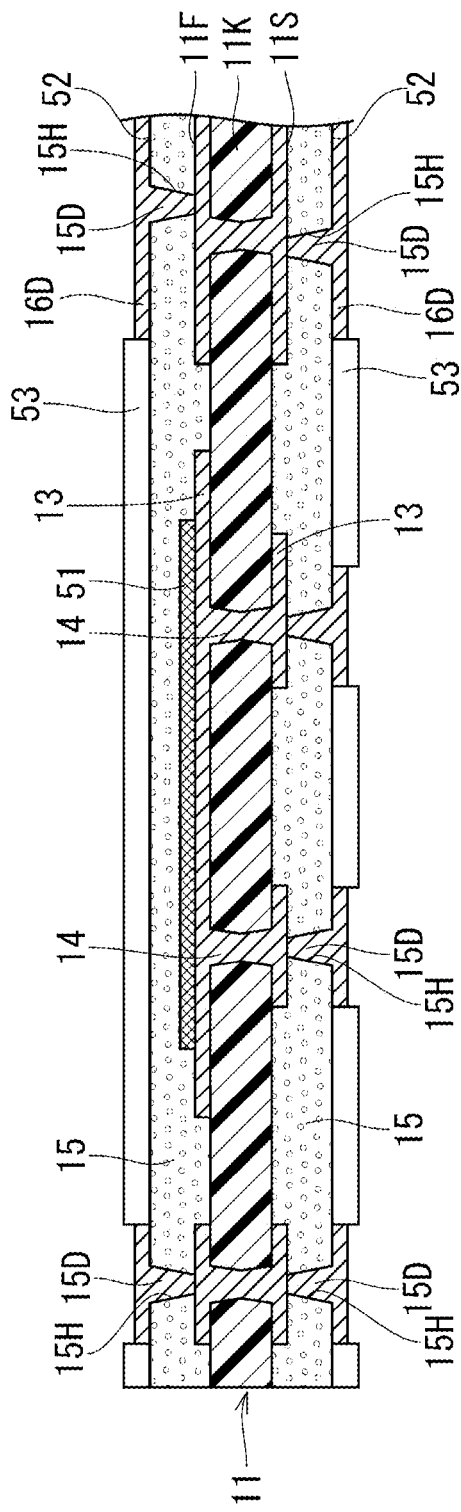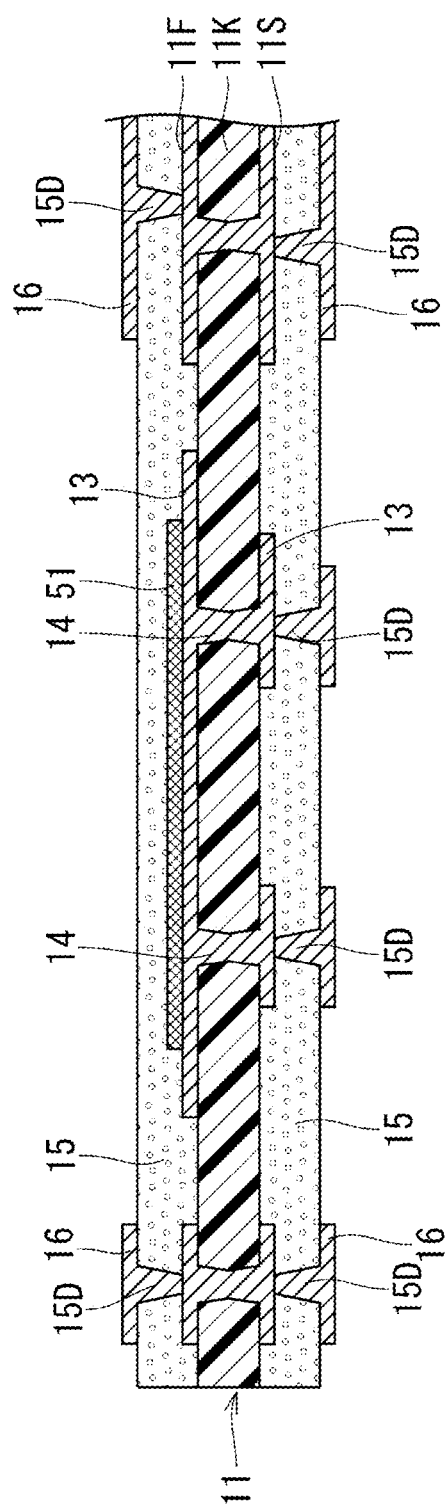

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-067403, filed Apr. 12, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2010-245530 describes a wiring substrate having a cavity. In order to form the cavity, for example, cutting-processing using a router is performed. The entire contents of this publication are incorporated herein by reference.

SUMMARY OF THE INVENTION

According to one aspect of the present invention, a wiring substrate includes an insulating layer, and a build-up part formed on the insulating layer and including an interlayer insulating layer and a conductor layer. The build-up part has a cavity penetrating through the build-up part such that the cavity is formed to accommodate an electronic component and has an inner wall and a bottom surface having a groove and that the groove is extending entirely in an outer edge part of the bottom surface and formed continuously from the inner wall surface of the cavity.

According to another aspect of the present invention, a method for manufacturing a wiring substrate includes forming a build-up part on an insulating layer such that the build-up part includes an interlayer insulating layer and a conductor layer, forming a groove in the build-up part such that the groove partitions a release portion of the build-up part, and removing the release portion from the build-up part such that a cavity penetrating through the build-up part and formed to accommodate an electronic component is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A-3D are cross-sectional side views illustrating manufacturing processes of a wiring substrate according to an embodiment of the present invention;

FIGS. 5A and 5B are cross-sectional side views illustrating manufacturing processes of a wiring substrate according to an embodiment of the present invention;

FIGS. 6A and 6B are cross-sectional side views illustrating manufacturing processes of a wiring substrate according to an embodiment of the present invention;

DETAILED DESCRIPTION OF THE EMBODIMENTS

Figure 1:
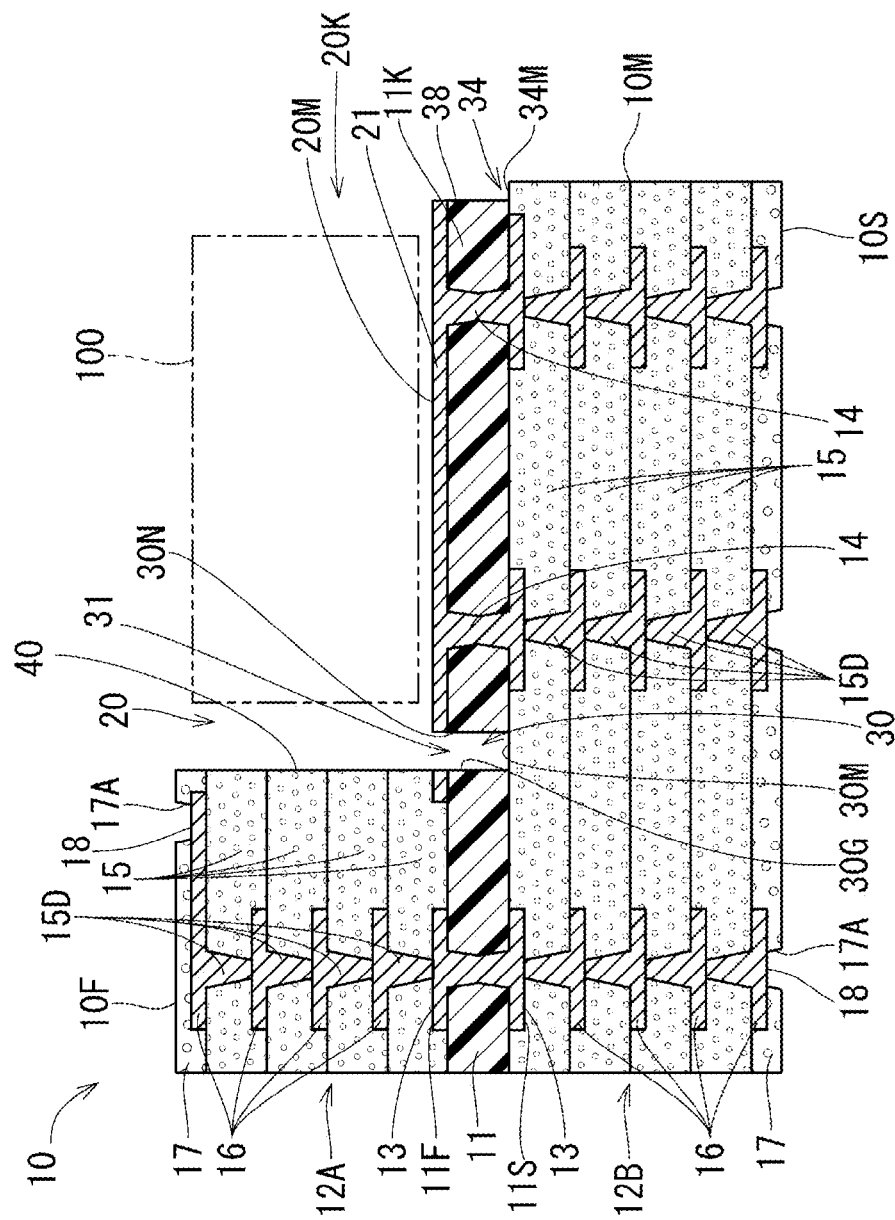
FIG. 1 is a cross-sectional side view of a wiring substrate according to a first embodiment of the present invention.

Embodiments will now be described with reference to the accompanying drawings, wherein like reference numerals designate corresponding or identical elements throughout the various drawings.

First Embodiment

In the following, the present embodiment is described with reference to FIGS. 1-12. As illustrated in FIG. 1, in a wiring substrate 10 of the present embodiment, a first build-up part (12A) is laminated on a first surface (11F), which is one of front and back surfaces of a core substrate 11, and a second build-up part (12B) is laminated on a second surface (11S), which is the other one of the front and back surfaces of the core substrate 11.

The core substrate 11 is formed by laminating a conductive layer 13 on each of both front and back sides (the first surface (11F) side and the second surface (11S) side) of an insulating base material (11K). The conductive layer 13 of the first surface (11F) and the conductive layer 13 of the second surface (11S) are each formed to have a predetermined pattern and are connected to each other by through-hole conductors 14 penetrating the insulating base material (11K).

The first build-up part (12A) and the second build-up part (12B) each have a structure in which interlayer insulating layers 15 and conductive layers 16 are alternately laminated from the core substrate 11 side. Adjacent conductive layers 16 are connected to each other by multiple via conductors (15D) penetrating an interlayer insulating layer 15. The via conductors (15D) each have a tapered shape that is reduced in diameter toward the core substrate 11. The interlayer insulating layers 15 are each formed of, for example, a prepreg (a B stage resin sheet formed by impregnating a core material formed of fibers such as a glass cloth with resin) or an insulating film for a build-up substrate (for example, a film formed of a thermosetting resin containing an inorganic filler without a core material).

A solder resist layer 17 is formed on the outermost conductive layer 16 formed outermost (the side farthest from the core substrate 11) among the conductive layers 16 of each of the first build-up part (12A) and the second build-up part (12B). Opening parts (17A) are formed in the solder resist layer 17, and pads 18 are formed by portions of the outermost conductive layer 16 exposed from the solder resist layer 17 by the opening parts (17A).

A cavity 20 is open on a first surface (10F), which is one of front and back surfaces of the wiring substrate 10. The cavity 20 penetrates the first build-up part (12A) and exposes the first surface (11F) of the core substrate 11 on a bottom surface (20M) of the cavity 20. Specifically, the conductive layer 13 of the first surface (11F) of the core substrate 11 is exposed on the bottom surface (20M) of the cavity 20, and a pad 21 for mounting a component is formed by the exposed portion of the conductive layer 13. An electronic component 100 accommodated in the cavity 20 is mounted on the pad 21.

In the example of the present embodiment, an inner wall surface 40 of the cavity 20 is formed by mechanical processing. Specifically, the inner wall surface 40 is a cutting-processed surface formed by cutting-processing, and this cutting-processed surface is formed by side processing with a router.

A groove 30 is formed on an outer edge part of the bottom surface (20M) of the cavity 20. In the example of the present embodiment, the groove 30 is formed by mechanical processing, specifically, is a cutting-processed groove formed with a front end of a router. The groove 30 (specifically, an inner surface of the groove 30) is continuously formed with the inner wall surface 40 of the cavity 20. The inner surface of the groove 30 includes a groove bottom surface (30M), a groove outer peripheral surface (30G), and a groove inner peripheral surface (30N), the groove outer peripheral surface (30G) and the groove inner peripheral surface (30N facing each other in a groove width direction of the groove 30. The groove outer peripheral surface (30G) is formed on extension of the inner wall surface 40 of the cavity 20 and is continuous with the inner wall surface 40.

Figure 2:
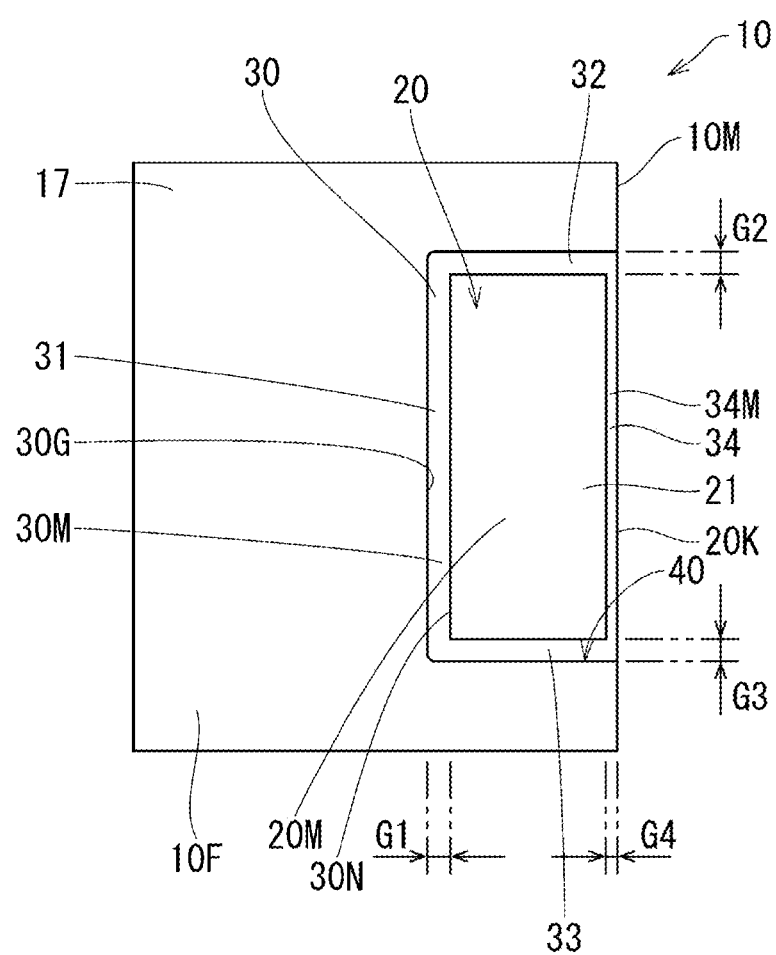
FIG. 2 is a plan view of the wiring substrate.

The cavity 20 is formed to have a side surface opening (20K) that opens on one side surface (10M) of the wiring substrate 10. As illustrated in FIG. 2, in the present embodiment, the cavity 20 has a quadrangular shape in a plan view, and one side thereof is open on the one side surface (10M) of the wiring substrate 10 by the side surface opening (20K). The cavity 20 is surrounded by the first build-up part (12A) from the remaining three sides of the cavity 20, and the inner wall surface 40 and the groove 30 are provided on the three sides.

As illustrated in FIGS. 1 and 2, a step part 34 is formed on an outer edge part of one side of an outer edge part of the bottom surface (20M) of the cavity 20 that is open on the one side surface (10M) of the wiring substrate 10 by the side surface opening (20K). The step part 34 is formed by cutting-processing the outer edge part of the open side of the bottom surface (20M) of the cavity 20 such that the outer edge part is depressed in a stepped shape. Specifically, a step surface 38 of the step part 34 is cut with a side surface of a router, and, in the step part 34, a lower step surface (34M), which is a step lower than the step surface 38, is cut with a front-end surface of the router. The lower step surface (34M) is connected to the one side surface (10M) of the wiring substrate 10.

On one side of the bottom surface (20M) of the cavity 20 that is open on the one side surface (10M), the lower step surface (34M) linearly extends across both ends of the groove 30 extending along the remaining three sides of the cavity 20. A width (G4) of the lower step surface (34M) of the step part 34 is smaller than a groove width of the groove 30 (specifically, a width of the groove bottom surface (30M) of the groove 30). Specifically, the width (G4) of the lower step surface (34M) of the step part 34 is smaller than any one of a width (G1) of a first groove part 31, a width (G2) of a second groove part 32 and a width (G3) of a third groove part 33 of the groove 30. The first groove part 31 is a linear portion of one side of the groove 30 on the opposite side with respect to the side surface opening (20K). The second groove part 32 and the third groove part 33 are respectively linear ports of the remaining two sides of the groove 30. In the present embodiment, the width (G1) of the first groove part 31, the width (G2) of the second groove part 32, and the width (G3) of the third groove part 33 are the same. However, it is also possible that least one of these widths is different. Further, in the present embodiment, the groove 30 is formed so as to have a substantially uniform width in a depth direction. However, for example, it is also possible that the groove 30 is formed so as to have a groove width that is reduced toward the groove bottom surface (30M).

As illustrated in FIG. 1, the groove bottom surface (30M) of the groove 30 and the lower step surface (34M) of the step part 34 are formed at the same depth from the first surface (11F) of the core substrate 11 and are smoothly continuous. The groove 30 and the step part 34 are formed at a depth penetrating the conductive layer 13 of the first surface (11F) of the core substrate 11. In the example of the present embodiment, the groove 30 and the step part 34 are formed to a depth that penetrates the entire core substrate 11, and the interlayer insulating layer 15 formed on the second surface (11S) of the core substrate 11 is exposed on the groove bottom surface (30M) of the groove 30 and the lower step surface (34M) of the step part 34.

Further, in the example of the present embodiment, the entire bottom surface (20M) of the cavity 20 except for an outer edge part (that is, an entire quadrangular portion surrounded by the groove 30 and the step part 34) is the above-described pad 21 for mounting a component. It is also possible that the pad 21 is provided only on a part of a portion of the bottom surface (20M) of the cavity 20 excluding the outer edge part. The wiring substrate 10 of the present embodiment is manufactured, for example, as follows.

(1) As illustrated in FIG. 3A, a copper-clad laminated plate (11Z) is prepared in which a copper foil (11C) is laminated on each of both front and back sides of the insulating base material (11K). The insulating base material (11K) contains, for example, an epoxy resin or a BT (bis-maleimide triazine) resin and a glass cloth.

(2) As illustrated in FIG. 3B, laser is irradiated to both sides of the copper-clad laminated plate (11Z), and through holes (14H) are formed.

(3) An electroless plating treatment is performed, and an electroless plating film (not illustrated in the drawings) is formed on the copper foils (11C) and on inner surfaces of the through holes (14H).

(4) As illustrated in FIG. 3C, a plating resist 50 of a predetermined pattern is formed on the electroless plating film on the copper foils (11C) on the front and back sides.

(5) An electrolytic plating treatment. As illustrated in FIG. 3D, the through holes (14H) are filled with electrolytic plating and the through-hole conductors 14 are formed, and an electrolytic plating film (13D) is laminated on a portion of the electroless plating film (not illustrated in the drawings) on the copper foils (11C) exposed from the plating resist 50.

Figure 4A:
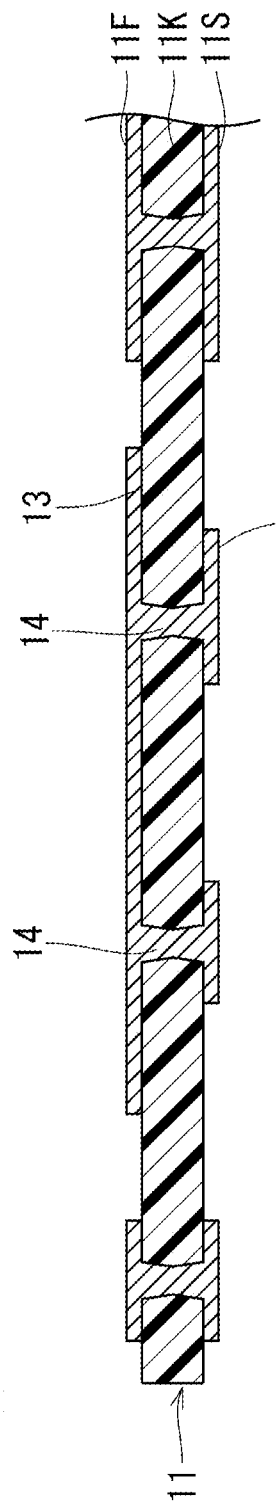
FIGS. 4A-4C are cross-sectional side views illustrating manufacturing processes of a wiring substrate according to an embodiment of the present invention.

(6) The plating resist 50 is removed, and the electroless plating film (not illustrated in the drawings) and the copper foils (11C) below the plating resist 50 are removed. As illustrated in FIG. 4A, the conductive layers 13 on both the front and back sides of the insulating base material (11K) are formed by the remaining electrolytic plating film (13D), electroless plating film and copper foils (11C). The conductive layers 13 on both sides of the insulating base material (11K) are connected to each other by the through-hole conductors 14. As a result, the core substrate 11 is formed.

Figure 4B:
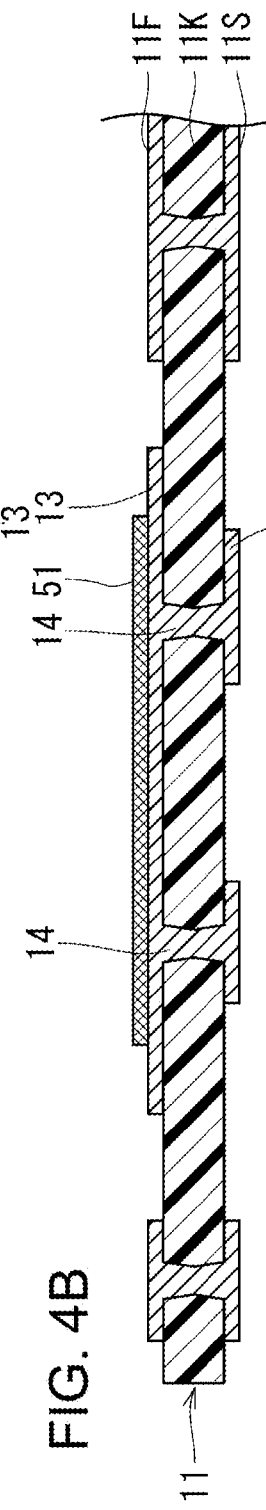

(7) As illustrated in FIG. 4B, a release layer 51 is laid on a part of the first surface (11F) of the core substrate 11. The release layer 51 is formed of, for example, a release film. For example, the conductive layer 13 of the first surface (11F) of the core substrate 11 is formed so as to be positioned under the entire release layer 51.

Figure 4C:
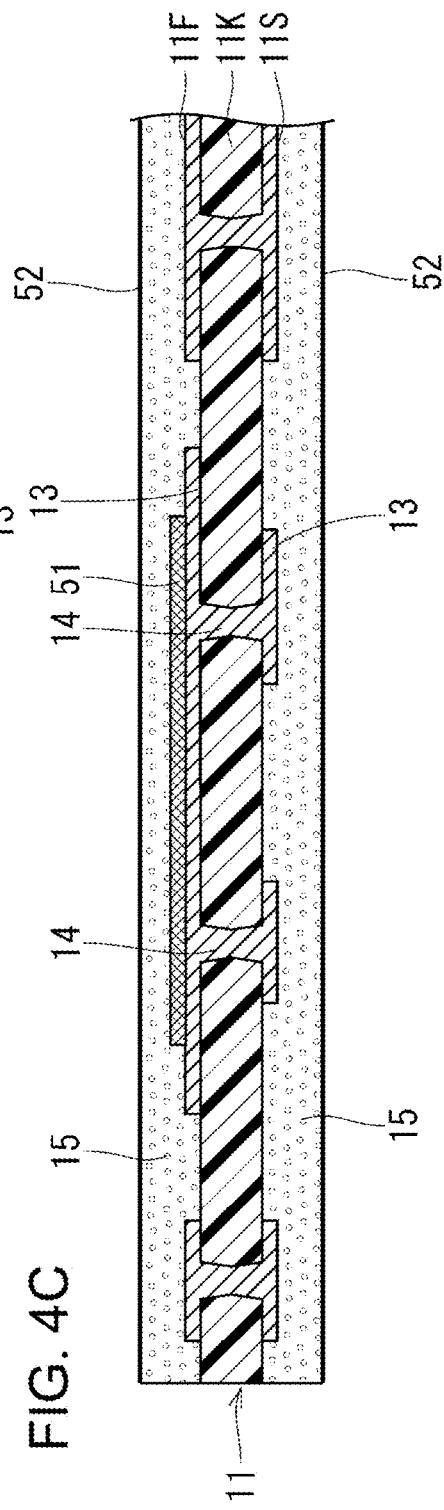
Figure 7:
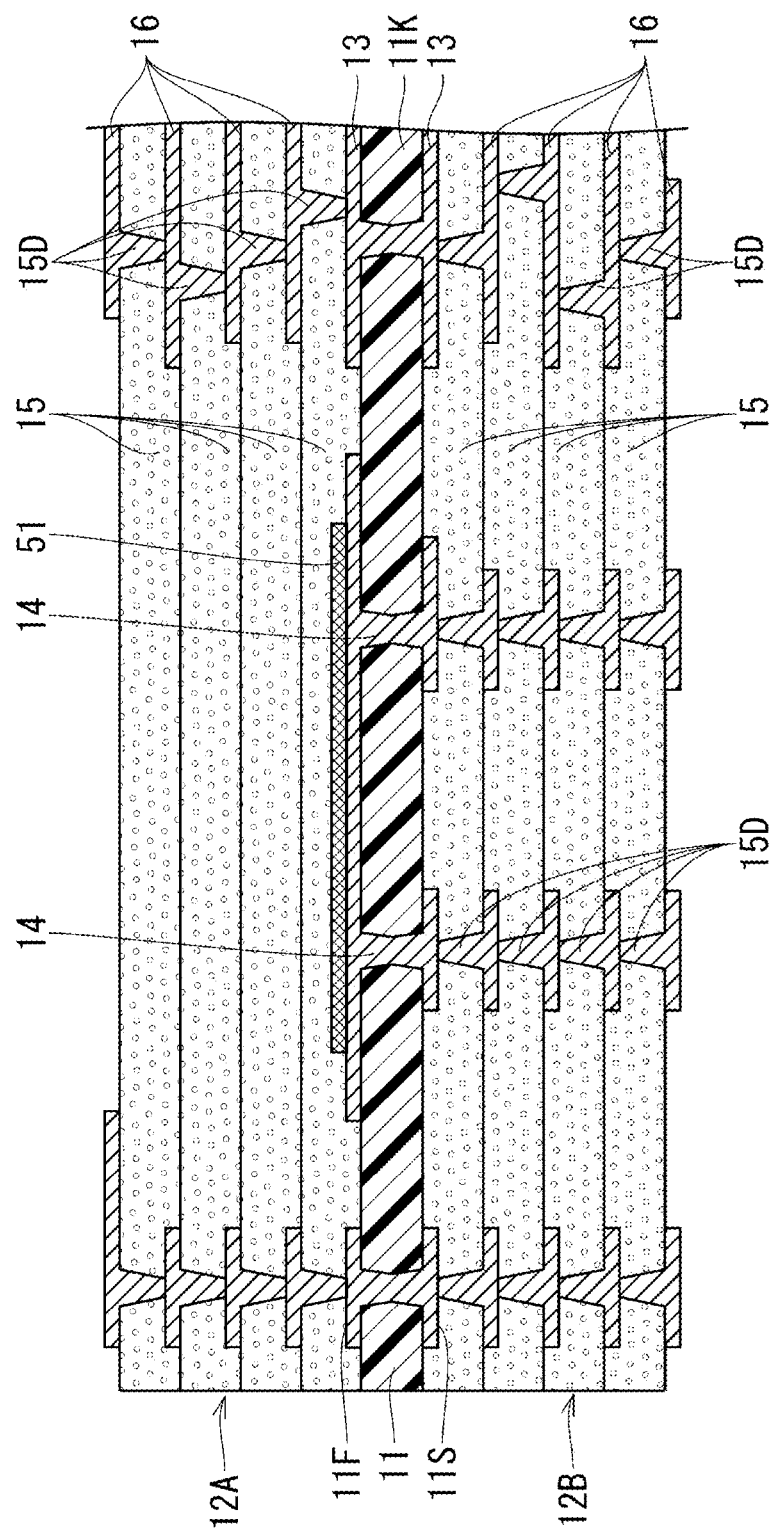
FIG. 7 is a cross-sectional side view illustrating a manufacturing process of a wiring substrate according to an embodiment of the present invention.

(8) As illustrated in FIG. 4C, a prepreg as an interlayer insulating layer 15 and a copper foil 52 are laminated on each of both sides of the core substrate 11, and then, hot pressing is performed. As a result, the interlayer insulating layers 15 are respectively formed on both sides of the core substrate 11. The release layer 51 is covered by the interlayer insulating layer 15 on the first surface (11F) side. During the hot pressing described above, on both the front and back sides of the core substrate 11, portions where the patterns of the conductive layers 13 are not formed are filled with resins of the prepregs. It is also possible that an insulating film for a build-up substrate is used instead of the prepreg as an interlayer insulating layer 15. In this case, an electroless plating film can be directly formed by an electroless plating treatment in (11) to be described later on the insulating film for a build-up substrate without laminating the copper foil 52.

(9) As illustrated in FIG. 5A, by irradiating laser to the interlayer insulating layers (15, 15) on both sides of the core substrate 11, multiple via holes (15H) penetrating the interlayer insulating layers 15 are formed. For example, these multiple via holes (15H) are formed at positions that do not overlap with the release layer 51 in a thickness direction.

(10) An electroless plating treatment is performed, and an electroless plating film (not illustrated in the drawings) is formed on the copper foils 52 laminated on the interlayer insulating layers 15 and on inner surfaces of the via holes (15H).

(11) As illustrated in FIG. 5B, a plating resist 53 of a predetermined pattern is formed on the electroless plating film on the copper foils 52 laminated on the interlayer insulating layers 15. For example, the plating resist 53 is formed to cover an entire portion of the interlayer insulating layer 15 formed right above the release layer 51 such that, in (13) below, a conductive layer 16 is not formed right above the release layer 51.

(12) An electrolytic plating treatment is performed. The via holes (15H) are filled with electrolytic plating, and the via conductors (15D) are formed (see FIG. 6A). Next, the plating resist 53 is peeled off, and the electroless plating film and the copper foils 52 below the plating resist 53 are removed. As a result, as illustrated in FIG. 6B, the conductive layers 16 are formed by an electrolytic plating film (16D), the electroless plating film and the copper foils 52 remaining on the interlayer insulating layers 15.

(13) The same processes as (9)-(12) described above are repeated, and, as illustrated in FIG. 7, a predetermined number of interlayer insulating layers 15 and a predetermined number of conductive layers 16 are alternately laminated on the conductive layers 13 of the core substrate 11. Further, conductive layers 16 adjacent to each other in a lamination direction are connected to each other by the via conductors (15D) penetrating the interlayer insulating layers 15. As a result, the first build-up part (12A) is formed on the first surface (11F) of the core substrate 11, and the second build-up part (12B) is formed on the second surface (11S) of the core substrate 11.

Figure 8:
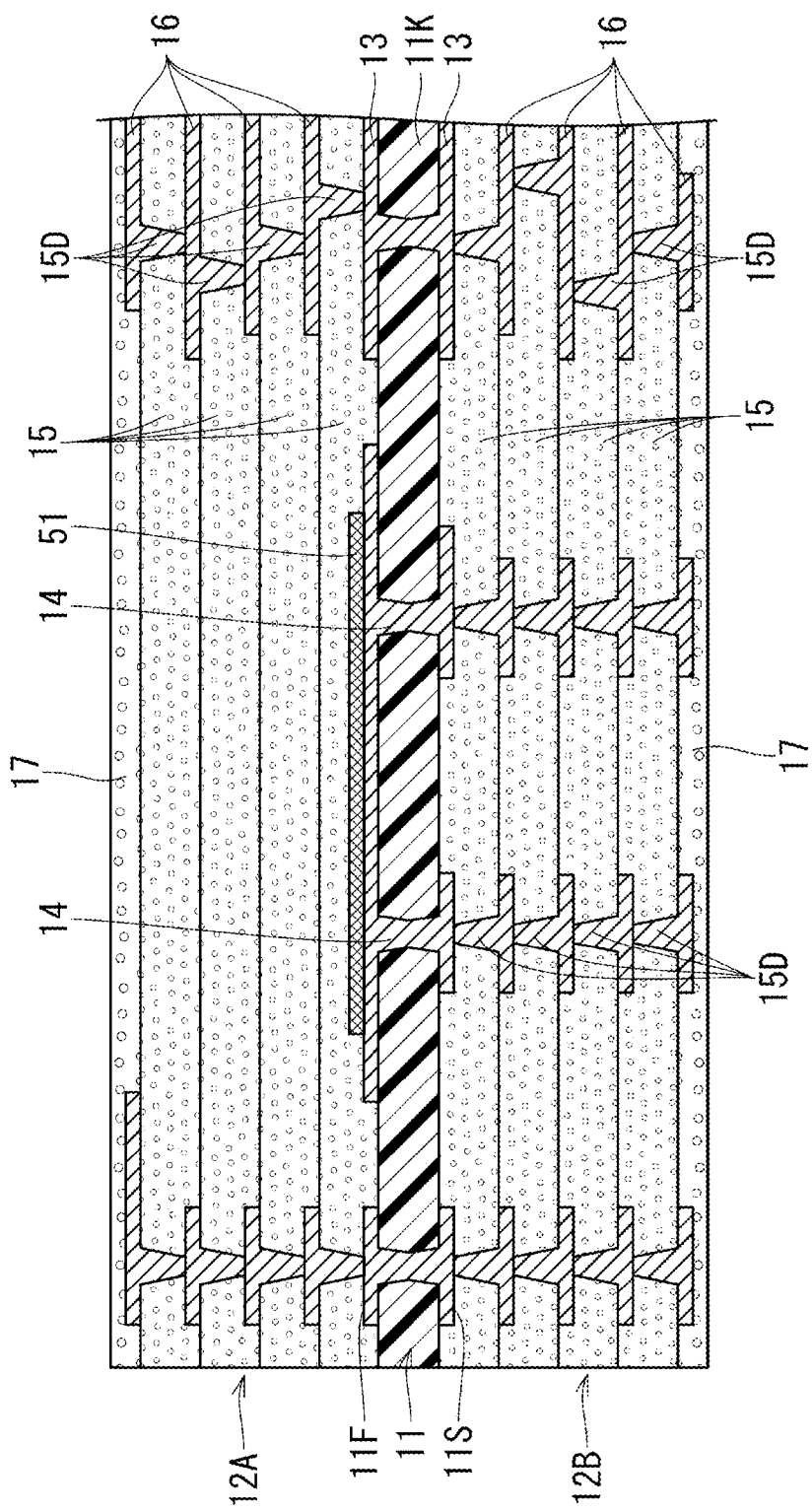
FIG. 8 is a cross-sectional side view illustrating a manufacturing process of a wiring substrate according to an embodiment of the present invention.

(14) As illustrated in FIG. 8, the solder resist layers 17 are respectively laminated on the outermost conductive layers 16 that are the farthest from the core substrate 11 on both the front and back sides.

Figure 9:
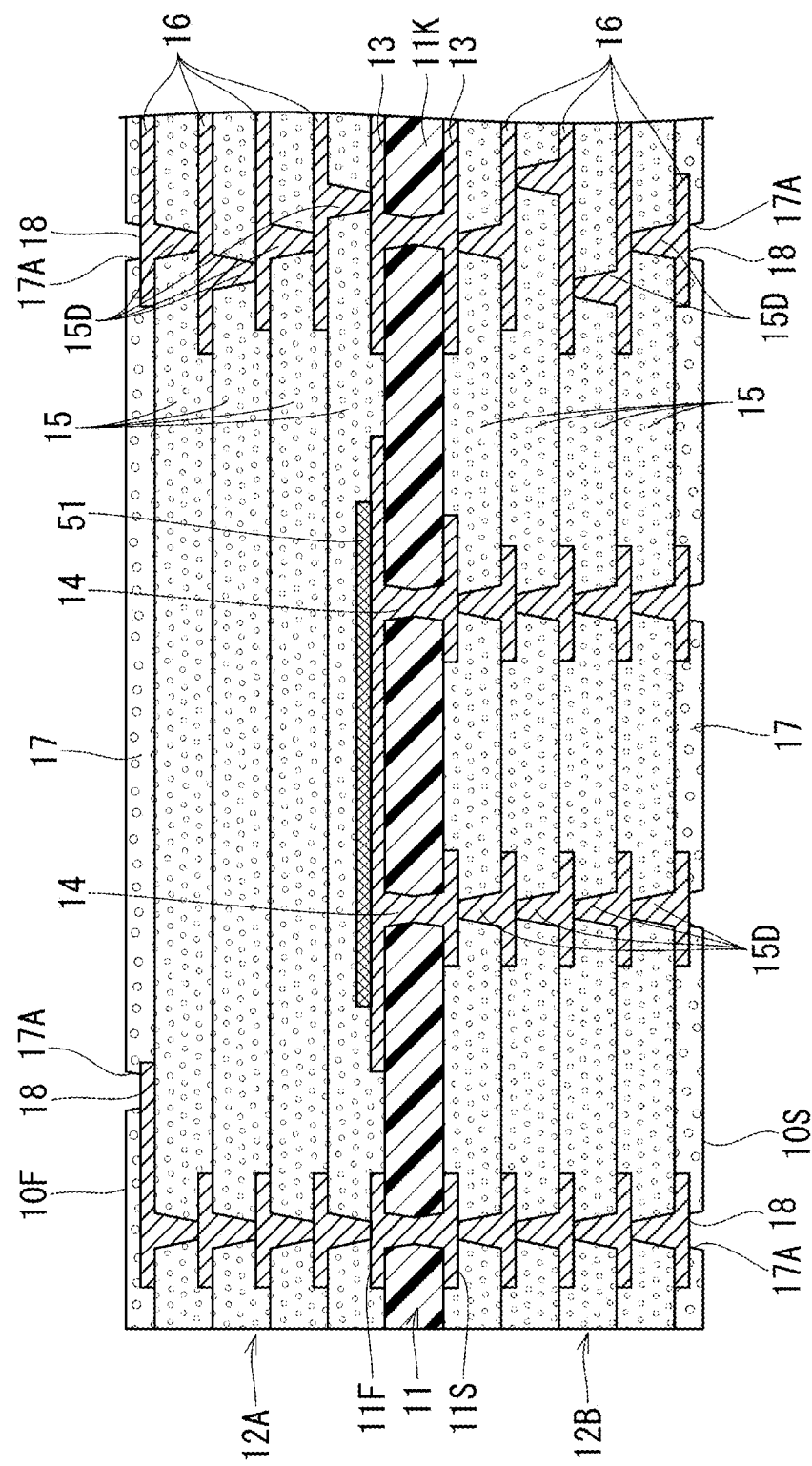
FIG. 9 is a cross-sectional side view illustrating a manufacturing process of a wiring substrate according to an embodiment of the present invention.

(15) As illustrated in FIG. 9, the opening parts (17A) are formed at predetermined places in the solder resist layers 17 on both the front and back sides of the core substrate 11, for example, by laser processing or photolithography processing. Then, the pads 18 are formed by portions of the outermost conductive layers 16 exposed from the solder resist layers 17 by the opening parts (17A).

Figure 10:
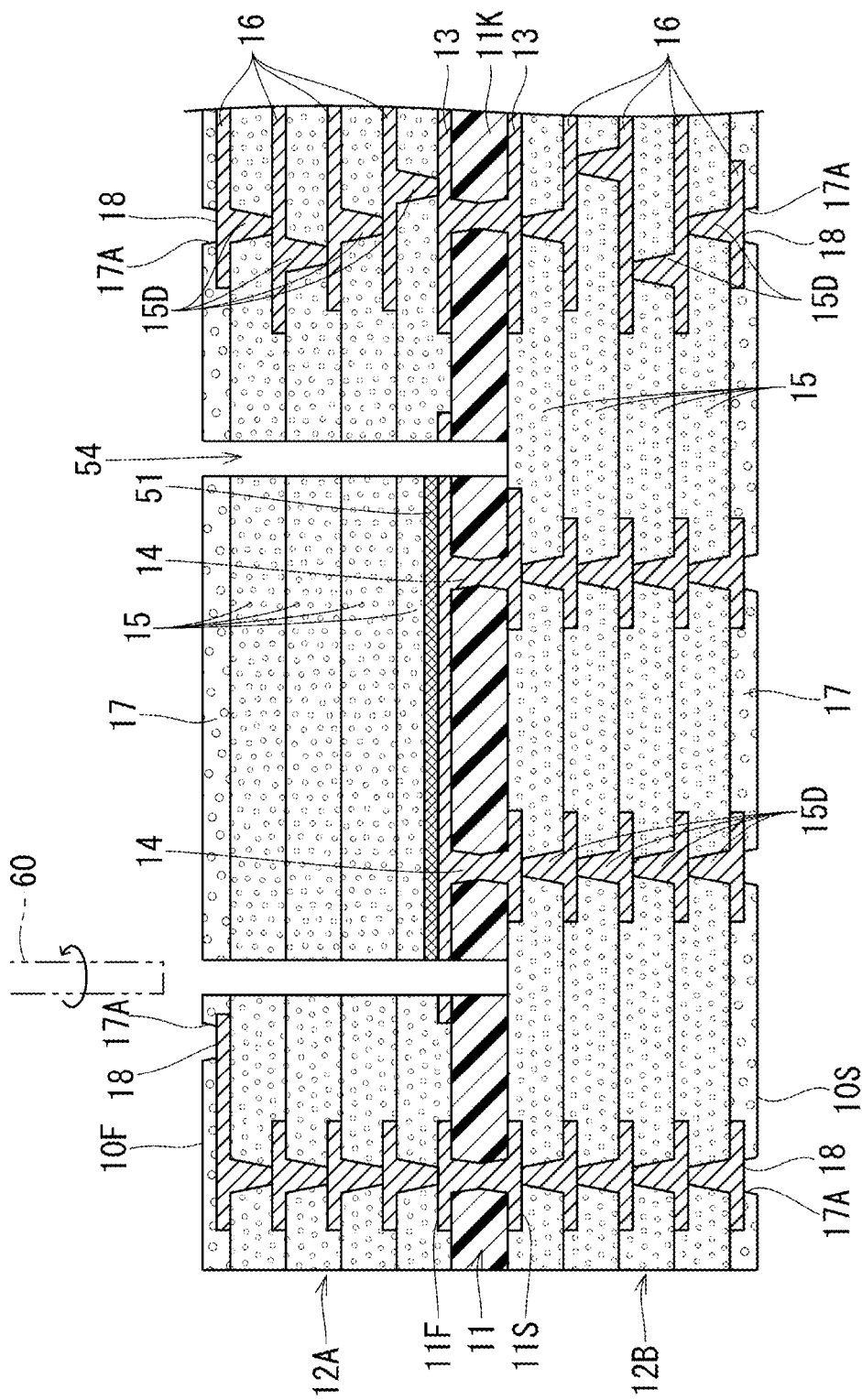
FIG. 10 is a cross-sectional side view illustrating a manufacturing process of a wiring substrate according to an embodiment of the present invention.

(16) Next, as illustrated in FIG. 10, an annular recess 54 is formed by plunging a router 60 from above the solder resist layer 17 on the first build-up part (12A) to a position penetrating the release layer 51 (for example, to a position penetrating the core substrate 11) and running the router 60 along a quadrangular frame so as to trace an outer edge part of the release layer 51. The router 60 is positioned such that a rotation axis direction thereof is a thickness direction of the core substrate 11. In this way, the inner wall surface 40 of the cavity 20, and the groove outer peripheral surface (30G) and the groove inner peripheral surface (30N) of the groove 30 can be formed to be perpendicular to the core substrate 11.

Figure 11:
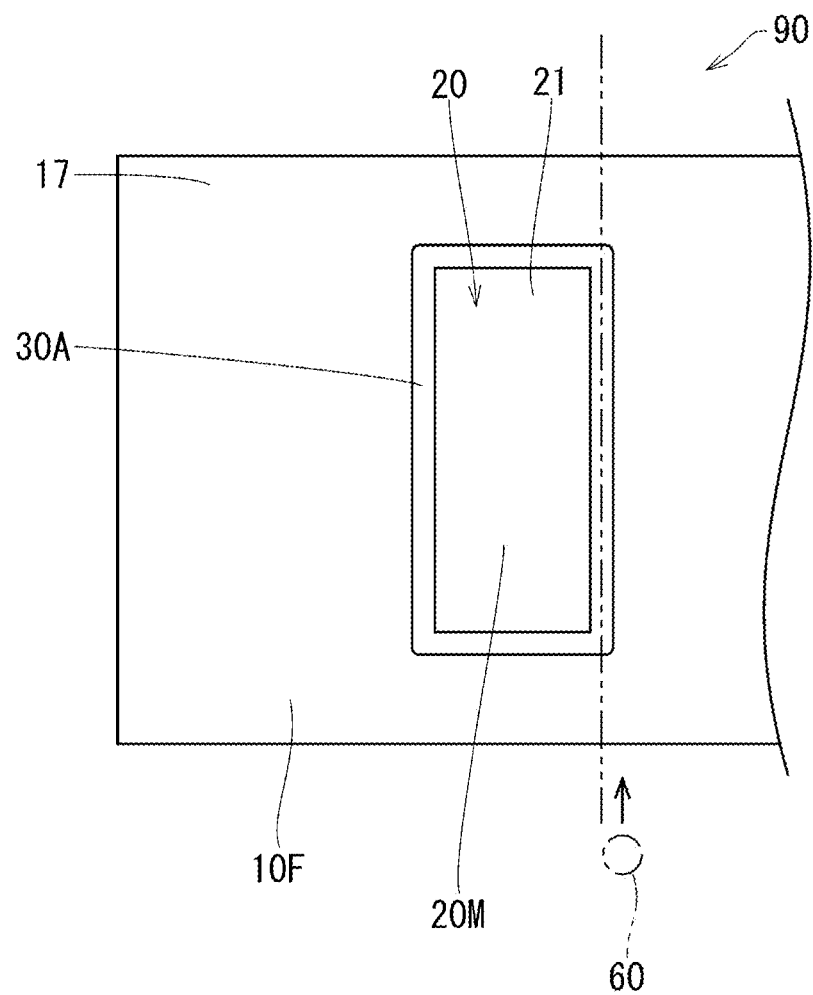
FIG. 11 is a plan view illustrating a manufacturing process of a wiring substrate according to an embodiment of the present invention.
Figure 12:
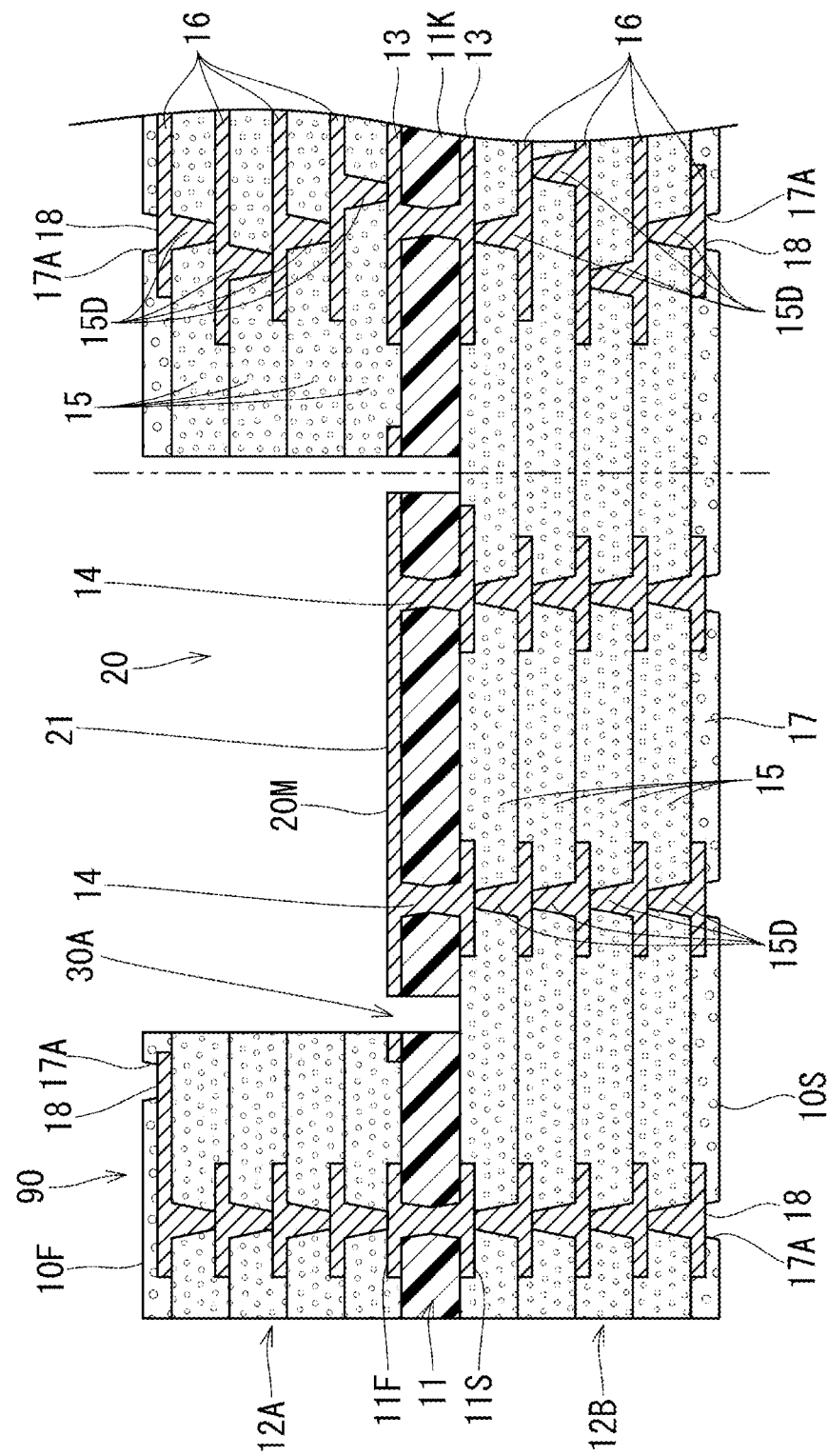
FIG. 12 is a cross-sectional side view illustrating a manufacturing process of a wiring substrate according to an embodiment of the present invention.

(17) Of the interlayer insulating layers 15, the conductive layers 16, the solder resist layer 17, and the release layer 51, portions formed on an inner side of the annular recess 54 are peeled off and removed, and the cavity 20 is formed (see FIGS. 11 and 12). As a result, of the conductive layer 13 of the first surface (11F) of the core substrate 11, a portion formed on the inner side of the annular recess 54 is exposed, and the pad 21 is formed by the exposed portion. Further, of the recess 54, a portion that is deeper than the conductive layer 13 (the pad 21) is left as an annular cutting-processed groove (30A) surrounding the pad 21. The cutting-processed groove (30A) is formed, for example, to have an overall substantially uniform width. In this way, a parent substrate 90 is obtained.

(18) Next, the wiring substrate 10 is formed by cutting the parent substrate 90 with the router 60. Specifically, as indicated by two-dot chain lines in FIGS. 11 and 12, the router 60 is run such that a cut cross section of the parent substrate 90 is formed on one side part of the cutting-processed groove (30A) (specifically, at a middle position in a width direction of the one side part). As a result, as illustrated in FIGS. 1 and 2, from this cut cross section, the one side surface (10M) of the wiring substrate 10 is formed and the side surface opening (20K) of the cavity 20 that opens on this one side surface (10M) is formed. Further, the remaining portion of the one side of the cutting-processed groove (30A) cut by the router 60 is open to the one side surface (10M) of the wiring substrate 10 and the step part 34 is formed, and the remaining three sides of the cutting-processed groove (30A) are left as the groove 30 described above. The router that cuts the parent substrate 90 may be different from the router 60 used for forming the inner wall surface 40 of the cavity 20 and the groove 30 in (17) described above.

(19) The pad 21 is subjected to a surface treatment such as formation of an organic protective film (OSP) or Ni/Pd/Au plating. As a result, the wiring substrate 10 is completed.

The description about the structure and the manufacturing method of the wiring substrate 10 of the present embodiment is as given above. Next, operation effects of the wiring substrate 10 are described. In the wiring substrate 10 of the present embodiment, since the cavity 20 is provided with the side surface opening (20K) that opens on the one side surface (10M) of the wiring substrate 10, even when the groove 30 is provided on the outer edge part of the bottom surface (20M) of the cavity 20, usage restrictions is reduced as compared to a conventional technology. Specifically, for example, when the groove 30 is formed in the entire outer edge part of the bottom surface (20M) of the cavity 20, since the electronic component 100 cannot be mounted on the groove 30, a dead space is likely to occur at the outer edge part of the cavity 20. As a result, usage of the wiring substrate may be restricted. In contrast, in the wiring substrate 10 of the present embodiment, the step part 34 is formed instead of the groove 30 on the outer edge part of the bottom surface (20M) of the cavity 20 that is open on the one side surface (10M) of the wiring substrate 10, and the width of the lower step surface (34M) of the step part 34 is smaller than the width of the groove 30. Therefore, as compared to the case where the groove 30 is formed in the entire outer edge part of the bottom surface (20M) of the cavity 20, a dead space at the outer edge part of the cavity 20 can be reduced. As a result, downsizing of the cavity 20 or the wiring substrate 10 can be achieved, and densification of circuits of the wiring substrate 10 can be achieved.

Further, since the width of the lower step surface (34M) of the step part 34 is smaller than the width of the groove bottom surface (30M) of the groove 30, the pad 21 can be formed close to the one side surface (10M) of the wiring substrate 10. As a result, the electronic component 100 can be positioned close to the one side surface (10M), and connection between the electronic component 100 and another electronic component or wiring substrate positioned on the one side of the wiring substrate 10 can be facilitated. Further, since the cavity 20 is open on the one side surface (10M) of the wiring substrate 10, a degree of freedom in positioning the electronic component 100 can be increased.

Second Embodiment

Figure 13:
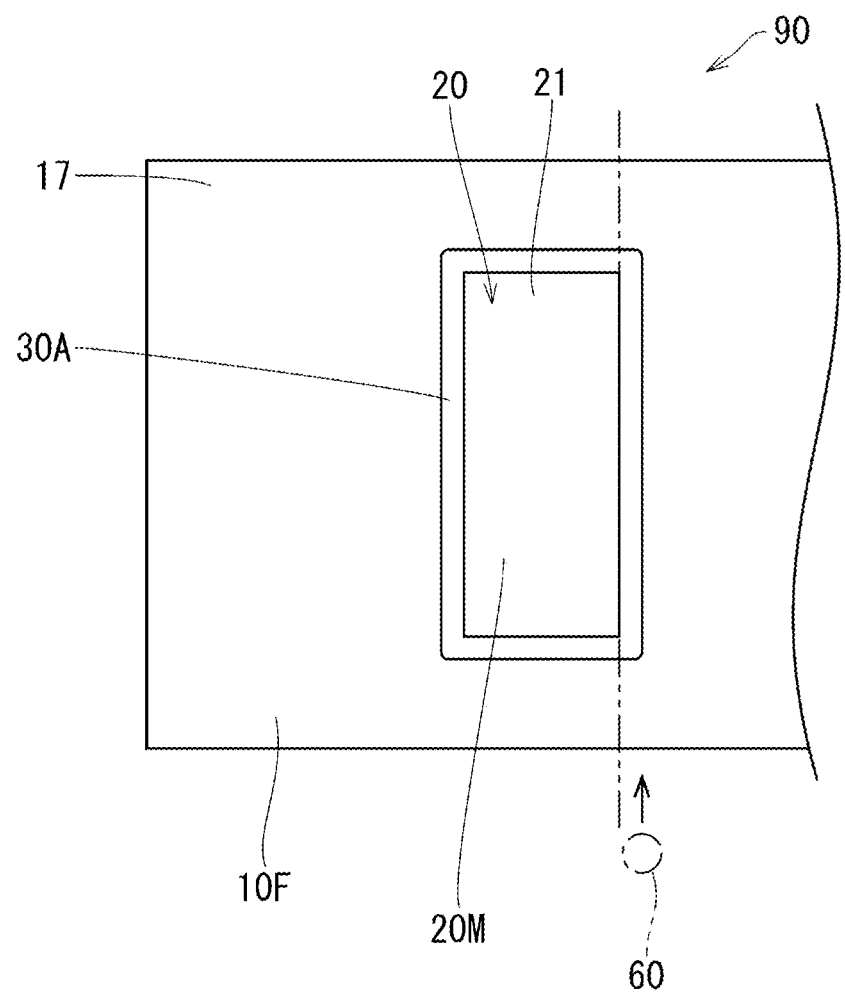
FIG. 13 is a plan view of a wiring substrate according to a second embodiment of the present invention.
Figure 14:
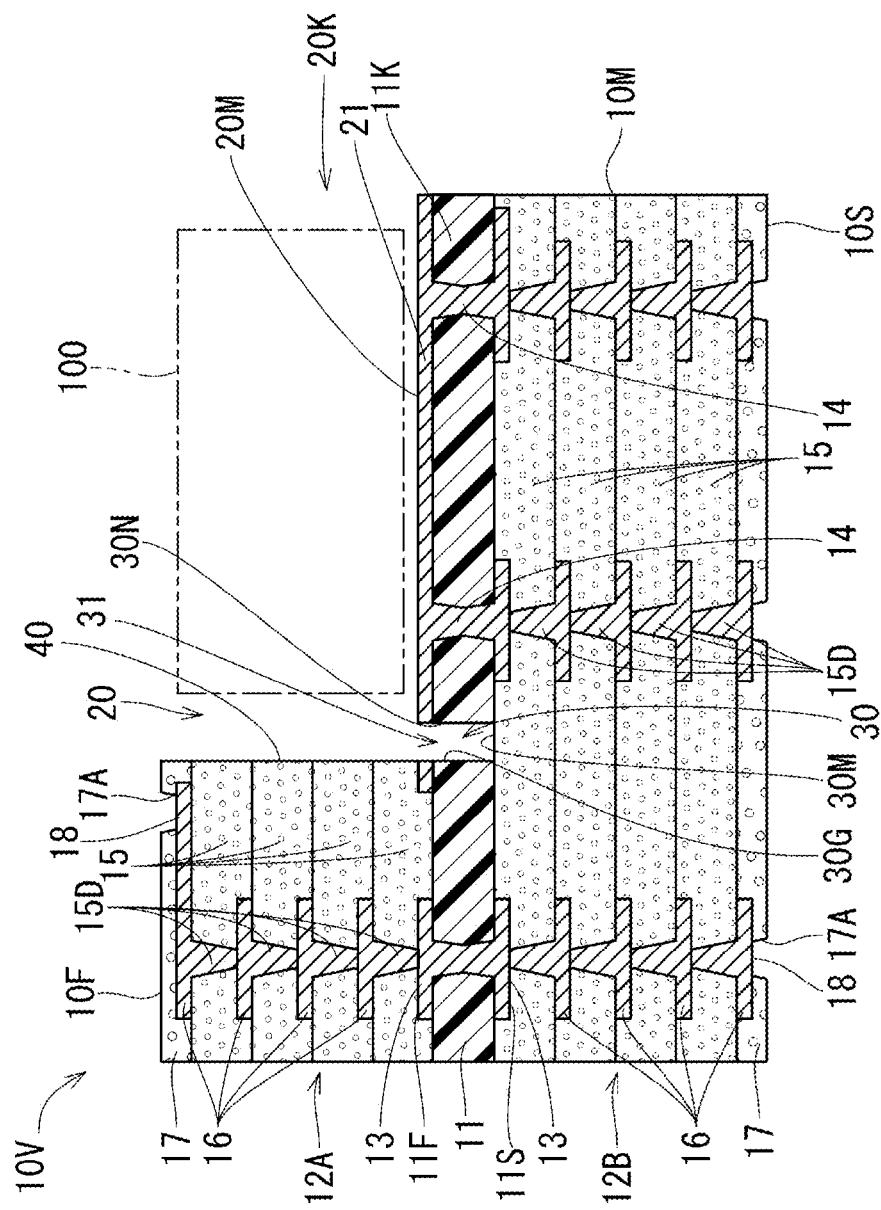
FIG. 14 is a cross-sectional side view illustrating a manufacturing process of a wiring substrate according to an embodiment of the present invention.

A wiring substrate (10V) of the present embodiment is different from the wiring substrate 10 of the first embodiment and the manufacturing method thereof in that the step part 34 is not provided and in the process of (20) of the manufacturing method described above. In the wiring substrate (10V) of the present embodiment, when the parent substrate 90 is cut to form the wiring substrate (10V), as indicated by a two-dot chain line in FIG. 13, the router 60 is run such that, of the parent substrate 90, a boundary between the one side part of the cutting-processed groove (30A) and the pad 21, or the pad 21, is cut. As a result, as illustrated in FIG. 14, the wiring substrate (10V) without a step part 34 is formed.

Other Embodiments (1) The cavity 20 may be provided at a corner of the quadrangular wiring substrate 10. In this case, a side surface opening (20K) that is open on two side surfaces of the wiring substrate 10 is formed on two sides of the cavity 20 that has a quadrangular shape in a plan view. Then, the inner wall surface 40 and the groove 30 are formed on the remaining two sides of the cavity 20.

(2) In the above embodiment, the cavity 20 has a quadrangular shape in a plan view. However, without being limited to this, the shape of the cavity 20 in a plan view may be, for example, a polygonal shape other than a quadrangular shape, or an irregular shape.

(3) In the above embodiment, the cutting of the parent substrate 90 during the formation of the wiring substrate 10 or the wiring substrate (10V) may be performed using a cutter instead of the router.

(4) In the above embodiment, it is also possible that the core substrate 11 is not provided.

(5) In the above embodiment, the wiring substrate 10 or the wiring substrate (10V) is formed by cutting the parent substrate 90. However, it is also possible that, without cutting the parent substrate 90, by forming the cavity 20 at an edge part of the parent substrate 90, the wiring substrate 10 or the wiring substrate (10V) is formed in which the cavity 20 is open on the one side surface (10M). For example, in the case of forming the wiring substrate 10, the annular recess 54 may be formed such that the one side part of the annular recess 54 is open on the one side surface (10M).

In the wiring substrate described in Japanese Patent Application Laid-Open Publication No. 2010-245530, since a cutting-processed groove formed using a router or the like is formed in an outer edge part of a bottom surface of the cavity, usage may be restricted.

A wiring substrate according to one aspect of the present invention includes: a cavity that opens on one of front and back surfaces of the wiring substrate and has an inner wall surface that is a cutting-processed surface; and a cutting-processed groove that is provided in an outer edge part of a bottom surface of the cavity and is continuously formed with the inner wall surface of the cavity. The cavity has a side surface opening that opens on one side surface of the wiring substrate.

A method for manufacturing a wiring substrate according to another aspect of the present invention includes: forming a release layer between layers of a part of a wiring substrate having a multilayer structure; plunging a router from one of front and back sides of the wiring substrate to a position penetrating the release layer and running the router so as to surround the part of the wiring substrate; forming a cavity by peeling between the layers to peel off the part of the wiring substrate; and running the router such that a side surface opening that opens on one side surface of the wiring substrate is formed in the cavity.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
    an insulating layer;
    a build-up part formed on the insulating layer and comprising an interlayer insulating layer and a conductor layer; and
    a conductor layer formed on the insulating layer and comprising an electronic component mounting pad configured to mount an electronic component,
    wherein the build-up part has a cavity penetrating through the build-up part such that the cavity is configured to accommodate the electronic component and has an inner wall and a bottom surface having a groove and that the groove is extending entirely in an outer edge part of the bottom surface and formed continuous with the inner wall surface of the cavity, and the conductor layer formed on the insulating layer is formed such that the electronic component mounting pad is formed on an entire portion of the bottom surface inside the groove and that the cavity is exposing the electronic component mounting pad of the conductor layer formed on the insulating layer.

2. The wiring substrate according to claim 1, wherein the insulating layer is a core substrate.

3. The wiring substrate according to claim 2, wherein the build-up part is formed such that the groove is penetrating through the insulating layer.

4. The wiring substrate according to claim 2, wherein the build-up part is formed such that the groove is penetrating through the insulating layer.

5. The wiring substrate according to claim 1, wherein the build-up part is formed such that the groove is penetrating through the insulating layer.

6. The wiring substrate according to claim 1, wherein the bottom surface of the cavity has an electronic component mounting portion configured to mount the electronic component such that the groove is continuously surrounding the electronic component mounting portion.

7. The wiring substrate according to claim 1, wherein the cavity has an opening on a side surface of the build-up part.

8. The wiring substrate according to claim 7, wherein the groove of the bottom surface is extending entirely in the outer edge part of the bottom surface such that the groove is forming a step part depressed at the opening on the side surface of the build-up part.

9. The wiring substrate according to claim 8, wherein the groove of the bottom surface is formed such that the step part has a lower step surface having a width that is smaller than a width of the groove.

10. The wiring substrate according to claim 1, wherein the build-up part is formed such that the cavity has a quadrangular shape having an opening on one side and three sides forming the inner wall surface of the cavity.

* * * * *